(12) United States Patent
Pavol

(10) Patent No.: US 9,093,599 B2
(45) Date of Patent: Jul. 28, 2015

(54) VAPOR DEPOSITION APPARATUS FOR CONTINUOUS DEPOSITION OF MULTIPLE THIN FILM LAYERS ON A SUBSTRATE

(71) Applicant: First Solar, Inc., Tempe, AZ (US)

(72) Inventor: Mark Jeffrey Pavol, Arvada, CO (US)

(73) Assignee: First Solar, Inc., Tempe, AR (US)

( * ) Notice: Subject to any disclaimer, the term of this patent is extended or adjusted under 35 U.S.C. 154(b) by 40 days.

(21) Appl. No.: 13/951,783

(22) Filed: Jul. 26, 2013

(65) Prior Publication Data

US 2015/0031164 A1  Jan. 29, 2015

(51) Int. Cl.
  *H01L 31/18* (2006.01)
  *H01L 21/02* (2006.01)

(52) U.S. Cl.
  CPC ........ *H01L 31/1828* (2013.01); *H01L 31/1876* (2013.01); *H01L 21/02551* (2013.01)

(58) Field of Classification Search
  USPC ......................................................... 438/61
  See application file for complete search history.

(56) References Cited

U.S. PATENT DOCUMENTS

| | | |
|---|---|---|
| 3,682,578 A | 8/1972 | Lachiche |
| 3,880,633 A | 4/1975 | Jordan et al. |
| 4,515,107 A | 5/1985 | Fournier et al. |
| 4,636,401 A | 1/1987 | Yamazaki et al. |
| 4,798,166 A | 1/1989 | Hirooka et al. |
| 4,950,615 A | 8/1990 | Basol et al. |
| 5,016,562 A | 5/1991 | Madan et al. |
| 5,147,498 A | 9/1992 | Nashimoto |
| 5,248,349 A | 9/1993 | Foote et al. |
| 5,288,515 A | 2/1994 | Nakamura et al. |
| 5,304,499 A | 4/1994 | Bonnet et al. |
| 5,334,251 A | 8/1994 | Nashimoto |
| 5,366,764 A | 11/1994 | Sunthankar |
| 5,372,646 A | 12/1994 | Foote et al. |
| 5,470,397 A | 11/1995 | Foote et al. |
| 5,536,333 A | 7/1996 | Foote et al. |

(Continued)

FOREIGN PATENT DOCUMENTS

| | | |
|---|---|---|
| AE | 65336 | 3/2004 |
| AE | 65337 | 3/2004 |

(Continued)

OTHER PUBLICATIONS

EP Search Report and Opinion dated Dec. 16, 2011 from Application No. EP11162987.9.

(Continued)

*Primary Examiner* — Stephen W Smoot
(74) *Attorney, Agent, or Firm* — MacMillan, Sobanski & Todd, LLC

(57) ABSTRACT

Vapor deposition apparatus for forming stacked thin films on discrete photovoltaic module substrates conveyed in a continuous non-stop manner through the apparatus are provided. The apparatus includes a first sublimation compartment positioned over a first deposition area of said apparatus, a second sublimation compartment positioned over a second deposition area of said apparatus, and an internal divider positioned therebetween and defining a middle seal member. An actuator is attached to the internal divider and is configured to move the internal divider to control intermixing of first source material vapors and second source material vapors within the first deposition area and the second deposition area. Methods are also generally provided for depositing stacked thin films on a substrate.

21 Claims, 5 Drawing Sheets

(56) References Cited

U.S. PATENT DOCUMENTS

| | | |
|---|---|---|
| 5,712,187 A | 1/1998 | Li et al. |
| 5,772,715 A | 6/1998 | McMaster et al. |
| 5,916,375 A | 6/1999 | Agui et al. |
| 5,994,642 A | 11/1999 | Higuchi et al. |
| 6,137,048 A | 10/2000 | Wu et al. |
| 6,171,641 B1 | 1/2001 | Okamoto et al. |
| 6,251,701 B1 | 6/2001 | McCandless et al. |
| 6,423,565 B1 | 7/2002 | Barth et al. |
| 6,444,043 B1 | 9/2002 | Gegenwart et al. |
| 6,719,848 B2 | 4/2004 | Faykosh et al. |
| 7,194,197 B1 | 3/2007 | Wendt et al. |
| 7,220,321 B2 | 5/2007 | Barth et al. |
| 7,301,155 B2 | 11/2007 | Tokuda et al. |
| 7,901,975 B2 | 3/2011 | Chen |
| 7,939,363 B1 | 5/2011 | Johnson et al. |
| 8,252,619 B2 | 8/2012 | Schaeffer et al. |
| 8,349,084 B2 | 1/2013 | Johnson et al. |
| 2002/0078890 A1 | 6/2002 | Tsujii et al. |
| 2002/0117199 A1 | 8/2002 | Oswald |
| 2003/0044539 A1 | 3/2003 | Oswald |
| 2003/0129810 A1 | 7/2003 | Barth et al. |
| 2004/0213908 A1 | 10/2004 | Derderian et al. |
| 2005/0158891 A1 | 7/2005 | Barth et al. |
| 2008/0149179 A1 | 6/2008 | Romeo et al. |
| 2008/0187766 A1 | 8/2008 | Heider et al. |
| 2008/0264478 A1 | 10/2008 | Ahn et al. |
| 2008/0311298 A1 | 12/2008 | Kappler |
| 2009/0087940 A1 | 4/2009 | Kushiya |
| 2009/0194165 A1 | 8/2009 | Murphy et al. |
| 2009/0242029 A1 | 10/2009 | Paulson et al. |
| 2009/0250722 A1 | 10/2009 | Bruce et al. |
| 2010/0055827 A1 | 3/2010 | Barth et al. |
| 2010/0184249 A1 | 7/2010 | Chen |
| 2011/0139247 A1 | 6/2011 | Feldman-Peabody |
| 2011/0143491 A1 | 6/2011 | Rathweg et al. |
| 2011/0290175 A1 | 12/2011 | Paranjpe et al. |
| 2012/0028395 A1 | 2/2012 | Feldman-Peabody et al. |
| 2012/0052189 A1 | 3/2012 | Liu et al. |
| 2013/0122631 A1 | 5/2013 | Reed et al. |
| 2014/0024172 A1* | 1/2014 | Rathweg et al. ............. 438/102 |

FOREIGN PATENT DOCUMENTS

| | | |
|---|---|---|
| AE | 65338 | 3/2004 |
| DE | 102005062528 | 6/2007 |
| EP | 0853345 | 7/1998 |
| EP | 1160880 | 12/2001 |
| EP | 2343397 | 7/2011 |
| JP | 57049263 | 3/1982 |
| JP | 59011641 | 1/1984 |
| JP | 5021825 | 1/1993 |
| JP | 5021826 | 1/1993 |
| JP | 5291599 | 11/1993 |
| JP | 10004205 | 1/1998 |
| JP | 11135816 | 5/1999 |
| JP | 2000261015 | 9/2000 |
| JP | 2002064215 | 2/2002 |
| JP | 2002246356 | 8/2002 |
| WO | WO 03032406 | 10/2002 |
| WO | WO 2009105423 | 8/2009 |
| WO | WO 2009144492 | 12/2009 |

OTHER PUBLICATIONS

McCandless B.E. et al., Recrystallization and Sulfur Diffusion in CdCl$_2$-Treated CdTe/CdS Thin Films, Progress in Photovoltaics: Research and Applications, John Wiley and Sons, Chichester, GB, vol. 5, No. 4, pp. 249-260, Jul. 1, 1997.

Bonnet D, "Manufacturing of CSS CdTe Solar Cells", Thin Solid Films, Elsevier-Sequoia S.A. Lausanne, CH, vol. 361-362, No. 1, pp. 547-552, Feb. 1, 2000.

PCT International Search Report and Written Opinion, Application No. PCT/US2014/048390 dated Nov. 14, 2014.

* cited by examiner

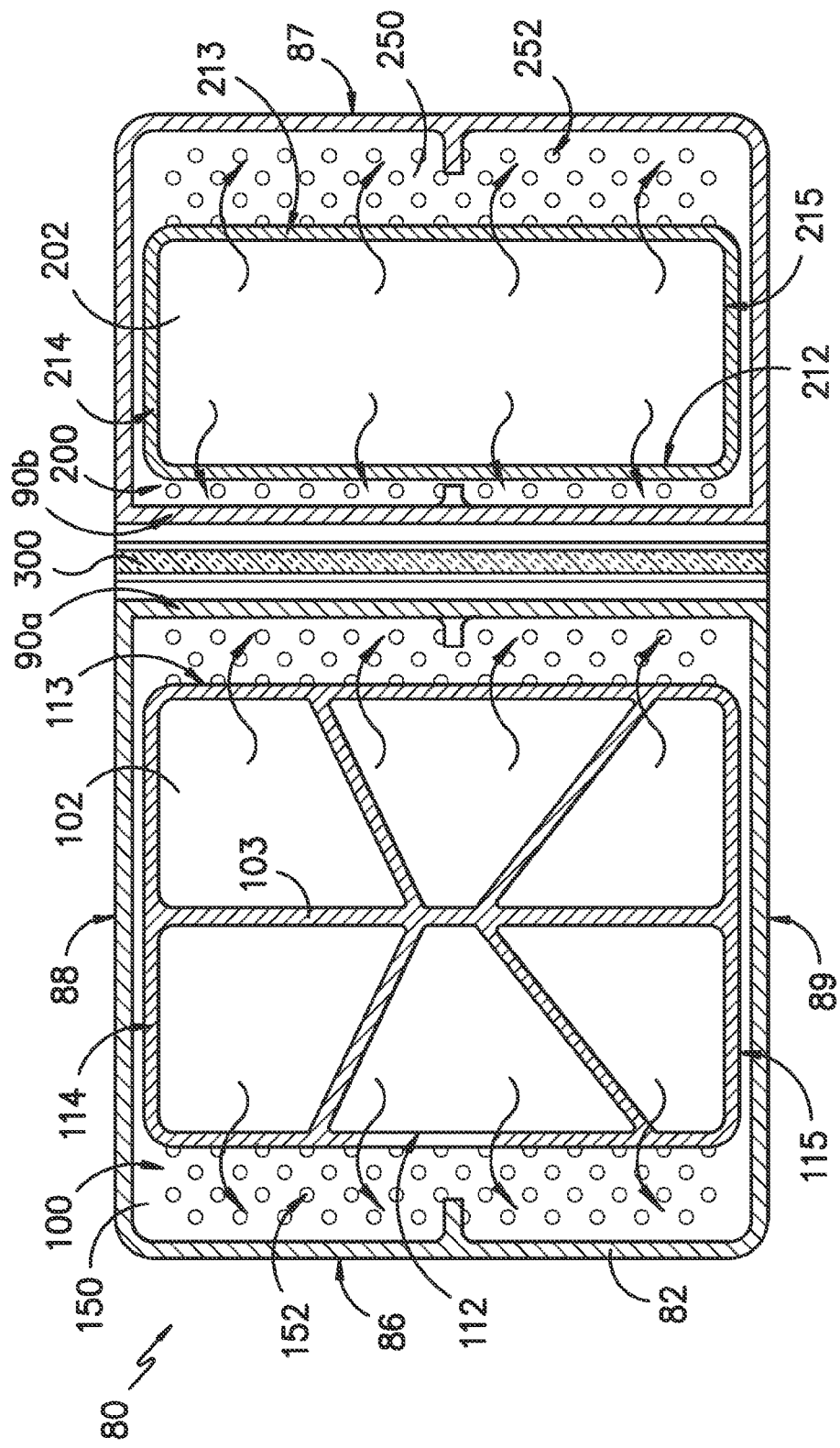
FIG. -5-

US 9,093,599 B2

VAPOR DEPOSITION APPARATUS FOR CONTINUOUS DEPOSITION OF MULTIPLE THIN FILM LAYERS ON A SUBSTRATE

FIELD OF THE INVENTION

The subject matter disclosed herein relates generally to methods and systems for depositing thin films during manufacture of thin film photovoltaic devices. More particularly, the subject matter disclosed herein relates generally to integrated systems and methods for the controlled deposition of a thin film layer with a subsequent thin film thereon (e.g., a treatment layer, a second thin film layer, etc.) during manufacture of cadmium telluride thin film photovoltaic devices.

BACKGROUND OF THE INVENTION

Thin film photovoltaic (PV) modules (also referred to as "solar panels") based on cadmium telluride (CdTe) paired with an n-type window layer (e.g., including cadmium sulfide (CdS), cadmium selenide (CdSe), and the like) as the photoreactive components are gaining wide acceptance and interest in the industry. CdTe is a semiconductor material having characteristics particularly suited for conversion of solar energy to electricity. For example, CdTe has an energy bandgap of about 1.45 eV, which enables it to convert more energy from the solar spectrum as compared to lower bandgap semiconductor materials historically used in solar cell applications (e.g., about 1.1 eV for silicon). Also, CdTe converts radiation energy in lower or diffuse light conditions as compared to the lower bandgap materials and, thus, has a longer effective conversion time over the course of a day or in cloudy conditions as compared to other conventional materials.

The junction of the n-type layer and the p-type absorber layer (i.e., the CdTe layer) is generally responsible for the generation of electric potential and electric current when the CdTe PV module is exposed to light energy, such as sunlight. Specifically, the cadmium telluride (CdTe) layer and the n-type window layer form a p-n heterojunction, where the CdTe layer acts as a p-type layer (i.e., an electron accepting layer) and the n-type layer serves as an electron donating layer. Free carrier pairs are created by light energy and then separated by the p-n heterojunction to produce an electrical current.

During the production of such CdTe PV modules, the heterojunction of the p-type absorber layer and the n-type window layer is typically formed by separately depositing different thin films, followed by annealing. For example, the n-type window layer may be deposited via sputtering deposition in a first deposition system, and the p-type absorber layer may be deposited by close spaced sublimation process in a separate system.

However, a need exists for methods and systems for increasing the efficiency of such separate deposition processes, as well as controlling the intermixing between adjacent thin film layers.

BRIEF DESCRIPTION OF THE INVENTION

Aspects and advantages of the invention will be set forth in part in the following description, or may be obvious from the description, or may be learned through practice of the invention.

A vapor deposition apparatus is generally provided to form stacked thin films on discrete photovoltaic module substrates conveyed in a continuous non-stop manner through said apparatus. In one embodiment, the apparatus includes a first sublimation compartment positioned over a first deposition area of said apparatus, a second sublimation compartment positioned over a second deposition area of said apparatus, and an internal divider positioned therebetween and defining a middle seal member. The first sublimation compartment is configured to heat a first source material therein to sublimate the first source material into first source material vapors, and the second sublimation compartment is configured to heat a second source material therein to sublimate the second source material into second source material vapors. An actuator is attached to the internal divider and is configured to move the internal divider to control intermixing of the first source material vapors and the second source material vapors within the first deposition area and the second deposition area.

Methods are also generally provided for depositing stacked thin films on a substrate. In one embodiment, a first source material is heated in a first receptacle positioned within a first chamber of a deposition head to form first source vapors, which are then directed through a first distribution plate. A second source material is heated in a second receptacle positioned within a second chamber of the deposition head to form second source vapors, which are directed through a second distribution plate. The first chamber is positioned adjacent to the second chamber, and intermixing between the first source vapors and the second source vapors is controlled (e.g., via positioning of an internal divider). A substrate is then transported past the first chamber and past the second chamber distribution plate to allow the first source vapors and the second source vapors to deposit thereon.

These and other features, aspects, and advantages of the present invention will become better understood with reference to the following description and appended claims, or may be obvious from the description or claims, or may be learned through practice of the invention.

BRIEF DESCRIPTION OF THE DRAWINGS

A full and enabling disclosure of the present invention, including the best mode thereof, is set forth in the specification, which makes reference to the appended drawings, in which.

DETAILED DESCRIPTION OF THE INVENTION

Figure 1:
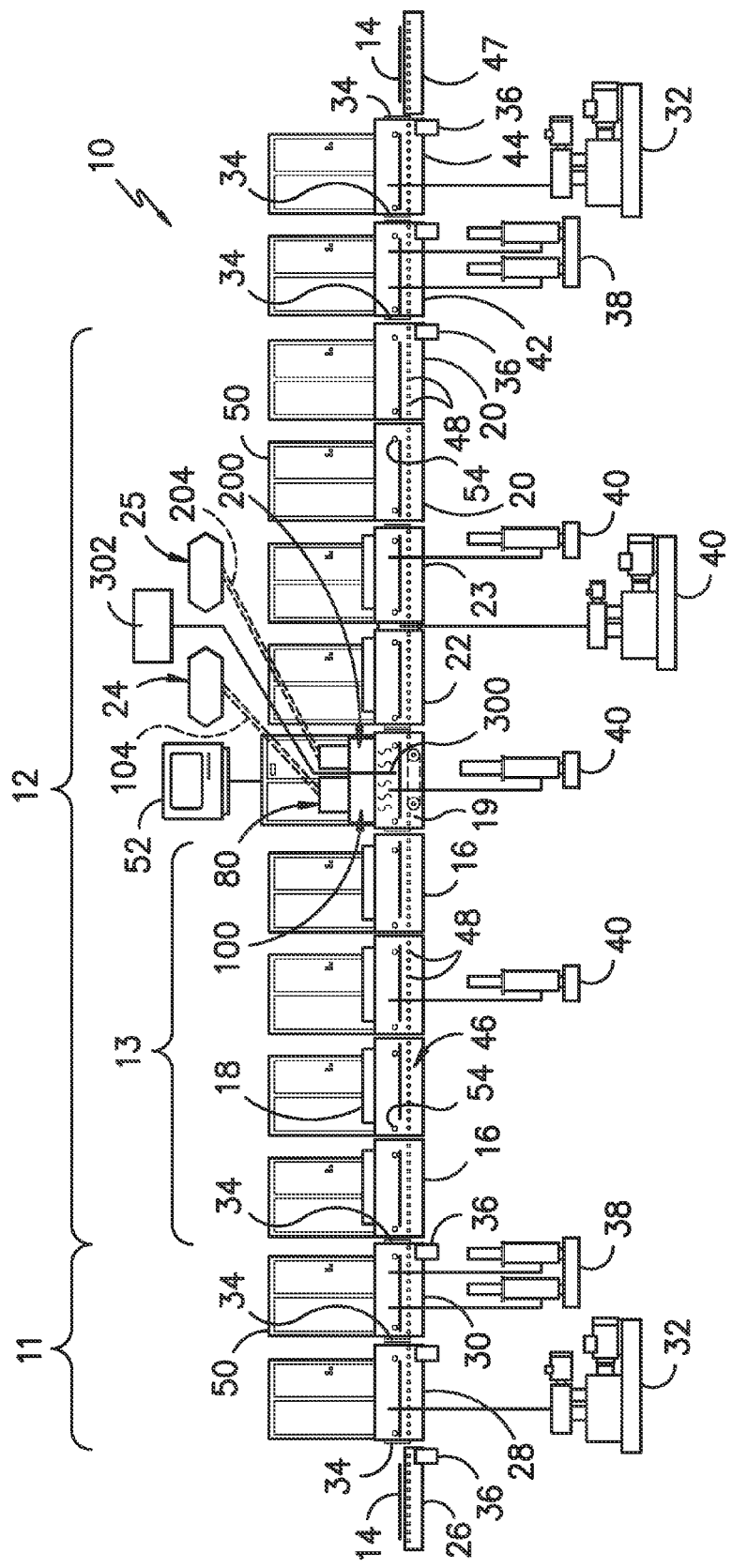
FIG. 1 is a plan view of a system that may incorporate embodiments of a vapor deposition apparatus of the present invention.

Reference now will be made in detail to embodiments of the invention, one or more examples of which are illustrated in the drawings. Each example is provided by way of explanation of the invention, not limitation of the invention. In fact, it will be apparent to those skilled in the art that various modifications and variations can be made in the present invention without departing from the scope or spirit of the invention. For instance, features illustrated or described as part of one embodiment, can be used with another embodiment to yield a still further embodiment. Thus, it is intended that the present invention encompass such modifications and variations as come within the scope of the appended claims and their equivalents.

In the present disclosure, when a layer is being described as "on" or "over" another layer or substrate, it is to be understood that the layers can either be directly contacting each other or have another layer or feature between the layers. Thus, these terms are simply describing the relative position of the layers to each other and do not necessarily mean "on top of" since the relative position above or below depends upon the orientation of the device to the viewer.

Additionally, although the invention is not limited to any particular film thickness, the term "thin" describing any film layers of the photovoltaic device generally refers to the film layer having a thickness less than about 10 micrometers ("microns" or "µm").

FIG. 1 illustrates an embodiment of a system 10 that may incorporate a vapor deposition chamber 19 that includes a vapor deposition apparatus 80 configured to sequentially deposit thin films (e.g., a first thin film layer, a second thin film layer, etc.) on discrete photovoltaic module substrates 14 conveyed in a continuous non-stop manner through said chamber 19. Through the use of the vapor deposition apparatus 80 in communication with a computing device 302 configured to control the positioning of the internal divider 300 via a motor or actuator 301, the amount of intermixing of the first source material vapors and the second source material vapors within the apparatus 80 can be controlled. As such, the intermixing of the deposited individual thin films can be selectively controlled by the user. The stacked thin films may be, for example, a n-type window layer and a p-type absorber layer. For example, the n-type window layer can include cadmium sulfide (CdS), cadmium selenide (CdSe), while the p-type absorber layer comprises cadmium telluride (CdTe). It should be appreciated that the present system 10 is not limited to the vapor deposition apparatus 19 illustrated in FIGS. 2-5. For example, the vapor deposition apparatus 80 can be configured to sequentially deposit more than two thin films by including additional compartments. For example, three deposition heads may be placed adjacent to each other, with a first internal divider between the first and second deposition heads and a second internal divider between the second and third deposition heads.

Referring to FIG. 1, the individual substrates 14 are initially placed onto a load conveyor 26, and are subsequently moved into an entry vacuum lock station 11 that includes a load vacuum chamber 28 and a load buffer chamber 30. A "rough" (i.e., initial) vacuum pump 32 is configured with the load vacuum chamber 28 to drawn an initial load pressure, and a "fine" (i.e., final) vacuum pump 38 is configured with the load buffer chamber 30 to increase the vacuum (i.e. decrease the initial load pressure) in the load buffer chamber 30 to reduce the vacuum pressure within the entry vacuum lock station 11. Valves 34 (e.g., gate-type slit valves or rotary-type flapper valves) are operably disposed between the load conveyor 26 and the load module 28, between the load vacuum chamber 28 and the load buffer chamber 30, and between the load vacuum chamber 30 and the heating station 13. These valves 34 are sequentially actuated by a motor or other type of actuating mechanism 36 in order to introduce the substrates 14 into the vacuum lock station 11 in a step-wise manner without affecting the vacuum within the subsequent heating station 13.

In operation of the system 10, an operational vacuum is maintained in the vacuum chamber 12 by way of any combination of rough and/or fine vacuum pumps 40. In order to introduce a substrate 14 into the load vacuum station 11, the load vacuum chamber 28 and load buffer chamber 30 are initially vented (with the valve 34 between the two modules in the open position). The valve 34 between the load buffer chamber 30 and the first heater module 16 is closed. The valve 34 between the load vacuum chamber 28 and load conveyor 26 is opened, and a substrate 14 is moved into the load vacuum chamber 28. At this point, the first valve 34 is shut, and the rough vacuum pump 32 then draws an initial vacuum in the load vacuum chamber 28 and load buffer chamber 30. The substrate 14 is then conveyed into the load buffer chamber 30, and the valve 34 between the load vacuum chamber 28 and load buffer chamber 30 is closed. The fine vacuum pump 38 then increases the vacuum in the load buffer chamber 30 to approximately the same vacuum in the vacuum chamber 12 and the heating station 13. At this point, the valve 34 between the load buffer chamber 30 and heating station 13 is opened, and the substrate 14 is conveyed into the first heater module 16.

Thus, the substrates 14 are transported into the exemplary system 10 first through the load vacuum chamber 28 that draws a vacuum in the load vacuum chamber 28 to an initial load pressure. For example, the initial load pressure can be less than about 250 mTorr, such as about 1 mTorr to about 100 mTorr. Optionally, a load buffer chamber can reduce the pressure to about $1 \times 10^{-7}$ Torr to about $1 \times 10^{-4}$ Torr, and then backfilled with an inert gas (e.g., argon) in a subsequent chamber within the system 10 to a deposition pressure (e.g., about 10 mTorr to about 100 mTorr).

The substrates 14 can then be transported into and through a heating station 13 including heating chambers 16. The plurality of heating chambers 16 define a pre-heat section 13 of the system 10 through which the substrates 14 are conveyed and heated to a first deposition temperature before being conveyed into the vapor deposition chamber 19. Each of the heating chambers 16 may include a plurality of independently controlled heaters 18, with the heaters defining a plurality of different heat zones. A particular heat zone may include more than one heater 18. The heating chambers 16 can heat the substrates 14 to a deposition temperature, such as about 350° C. to about 600° C. Although shown with four heating chambers 16, any suitable number of heating chambers 16 can be utilized in the system 10.

The substrates 14 can then be transferred into and through the vapor deposition apparatus 80 for sequential deposition of a first thin film onto the substrates 14 and a subsequent second thin film onto the first thin film. For example, the first thin film can be a n-type window layer, and the second thin film can be a p-type absorber layer (e.g., a cadmium telluride layer). As diagrammatically illustrated in FIG. 1, a first feed device 24 is configured with the vapor deposition apparatus 80 to supply a first source material, such as granular cadmium sulfide. Additionally, a second feed device 25 is configured with the vapor deposition apparatus 80 to supply a second source material, such as granular cadmium telluride. The feed devices 24, 25 may take on various configurations within the scope and spirit of the invention, and may function to supply the source material without interrupting the continuous vapor deposition process within the apparatus 80 or conveyance of the substrates 14 through the apparatus 80.

After deposition and treatment in the vapor deposition chamber 19, the substrates 14 can be transported into and through a post-heat chamber 22, an optional annealing chamber 23, and a series of cooling chambers 20. In the illustrated embodiment of system 10, at least one post-heat chamber 22 is located immediately downstream of the vapor deposition apparatus 19. The post-heat chamber 22 maintains a controlled heating profile of the substrate 14 until the entire substrate is moved out of the vapor deposition chamber 19, in order to prevent damage to the substrate 14, such as warping or breaking caused by uncontrolled or drastic thermal stresses. If, for example, the leading section of the substrate 14 were allowed to cool at an excessive rate as it exited the apparatus 19, a potentially damaging temperature gradient would be generated longitudinally along the substrate 14. This condition could result in breaking, cracking, or warping of the substrate from thermal stress.

In certain embodiments, the anneal chamber 23 (or a series of annealing chambers) can be present to further heat the substrates 14 sufficient to anneal the deposited material thereon. For example, the substrates 14 can be annealed in the anneal chamber 23 by heating, in certain embodiments, to an anneal temperature of about 500° C. to about 800° C.

A cool-down chamber(s) 20 is positioned downstream of the vapor deposition chamber. The cool-down chamber 20 allows the substrates 14 having the treated thin film to be conveyed and cooled at a controlled cool-down rate prior to the substrates 14 being removed from the system 10. The cool down chamber 20 may include a forced cooling system wherein a cooling medium, such as chilled water, refrigerant, gas, or other medium, is pumped through cooling coils (not illustrated) configured with the chamber 20. In other embodiments, a plurality of cool down chambers 20 can be utilized in the system 10.

An exit vacuum lock station 15 is configured downstream of the cool-down chamber 20, and operates essentially in reverse of the entry vacuum lock station 11 described above. For example, the exit vacuum lock station 15 may include an exit buffer module 42 and a downstream exit lock module 44. Sequentially operated valves 34 are disposed between the buffer module 42 and the last one of the cool-down modules 20, between the buffer module 42 and the exit lock module 44, and between the exit lock module 44 and an exit conveyor 47. A fine vacuum pump 38 is configured with the exit buffer module 42, and a rough vacuum pump 32 is configured with the exit lock module 44. The pumps 32, 38 and valves 34 are sequentially operated to move the substrates 14 out of the system 10 in a step-wise fashion without loss of vacuum condition within the system 10.

System 10 also includes a conveyor system 46 configured to move the substrates 14 into, through, and out of each of load vacuum station 12, the pre-heating station 13, the vapor deposition chamber 19, the post-heat chamber 22, and the cooling chambers 20. In the illustrated embodiment, this conveyor system 46 includes a plurality of individually controlled conveyors 48, with each of the various modules including a respective one of the conveyors 48. It should be appreciated that the type or configuration of the conveyors 48 may vary. In the illustrated embodiment, the conveyors 48 are roller conveyors having rotatably driven rollers that are controlled so as to achieve a desired conveyance rate of the substrates 14 through the respective module and the system 10 overall.

As described, each of the various modules and respective conveyors in the system 10 are independently controlled to perform a particular function. For such control, each of the individual modules may have an associated independent controller 50 configured therewith to control the individual functions of the respective module. The plurality of controllers 50 may, in turn, be in communication with a central system controller 52, as diagrammatically illustrated in FIG. 1. The central system controller 52 can monitor and control (via the independent controllers 50) the functions of any one of the modules so as to achieve an overall desired heat-up rate, deposition rate, cool-down rate, conveyance rate, and so forth, in processing of the substrates 14 through the system 10.

Referring to FIG. 1, for independent control of the individual respective conveyors 48, each of the modules may include any manner of active or passive sensors 54 that detects the presence of the substrates 14 as they are conveyed through the module. The sensors 54 are in communication with the respective module controller 50, which is in turn in communication with the central controller 52. In this manner, the individual respective conveyor 48 may be controlled to ensure that a proper spacing between the substrates 14 is maintained and that the substrates 14 are conveyed at the desired conveyance rate through the vacuum chamber 12.

Figure 2:
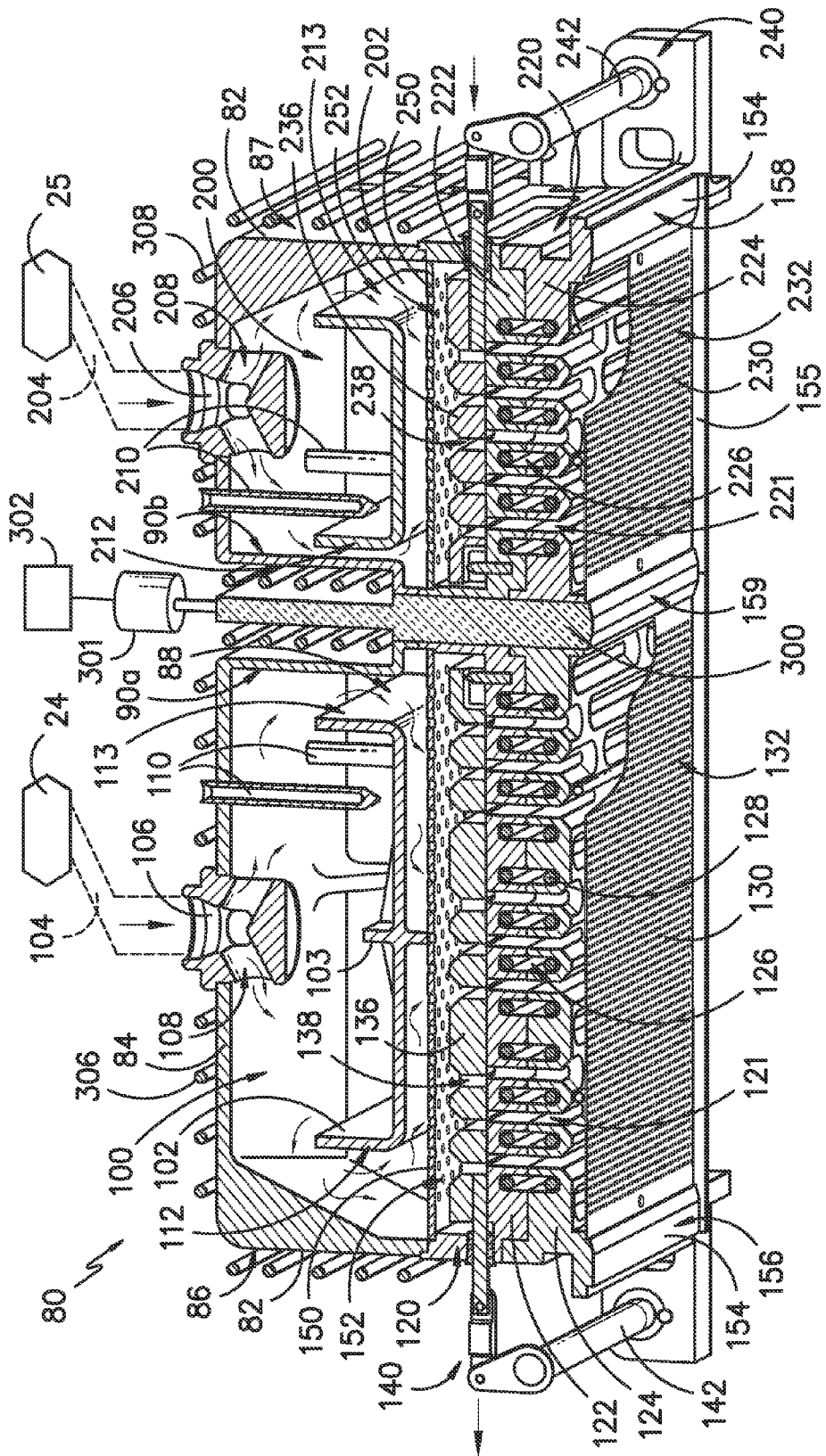
FIG. 2 is a cross-sectional view of an embodiment of a vapor deposition apparatus according to aspects of the invention in a first operational position.
Figure 3:
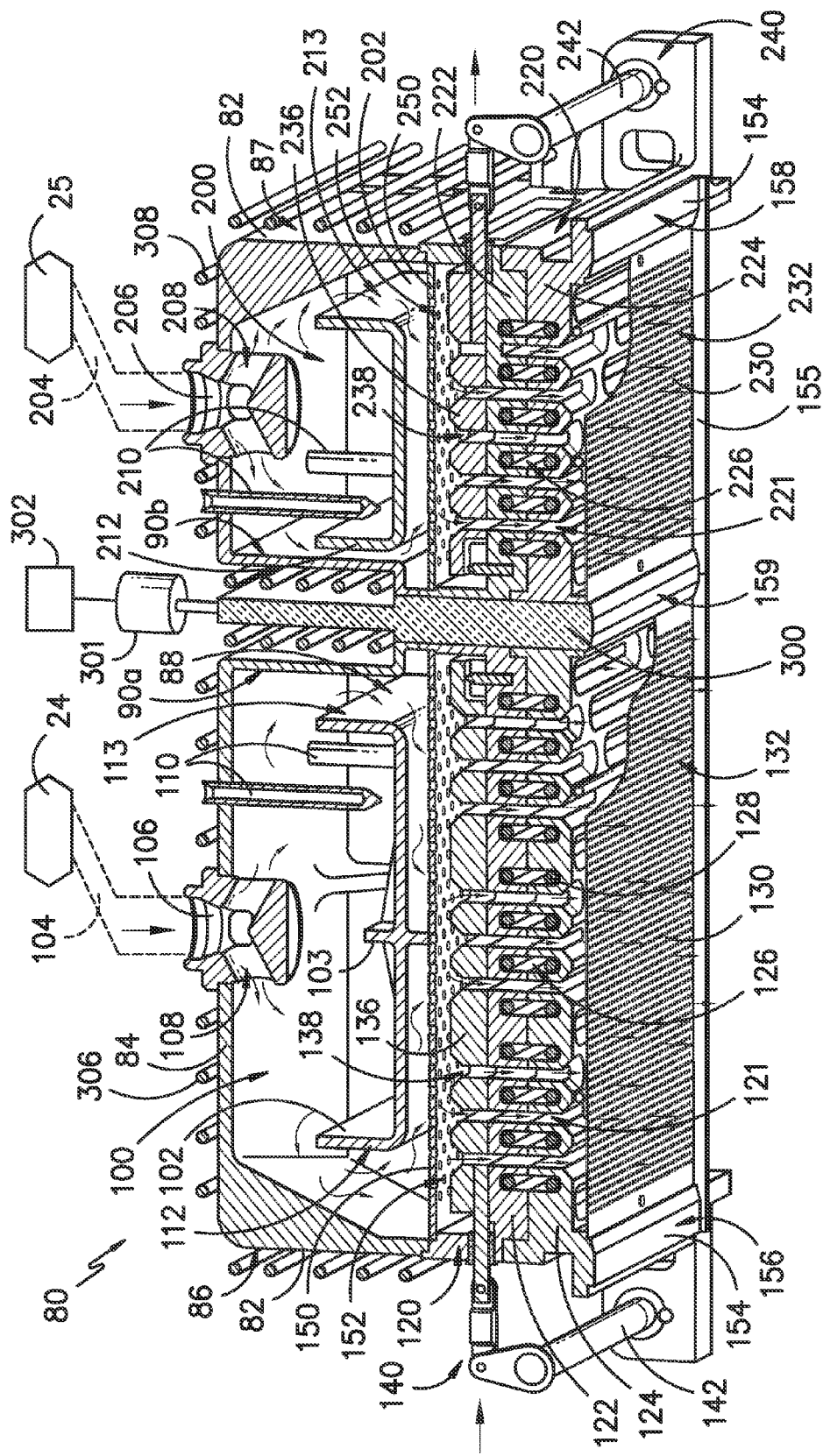
FIG. 3 is a cross-sectional view of the embodiment of FIG. 2 in a second operational position.

FIGS. 2 through 5 relate to a particular embodiment of the vapor deposition apparatus 80, which can be utilized in conjunction with the vapor deposition chamber 19. Referring to FIGS. 2 and 3 in particular, the apparatus 80 includes a deposition head 82 that is divided into two compartments: a first sublimation compartment 100 and a second sublimation compartment 200. During deposition, the substrates 14 pass first under the first sublimation compartment 100 for deposition of a first material (e.g., an n-type semiconductor material, such as CdS, CdSe, etc.) and then under the second sublimation compartment 200 for deposition of a second material (e.g., a p-type absorber layer, such as CdTe). As stated above, following deposition in the vapor deposition chamber 80, the substrates 14 pass into the post-heat chamber 22. Additionally, the substrates 14 can pass through an optional anneal chamber 23, if desired, to anneal the deposited thin film layer and treatment material.

Figure 4:
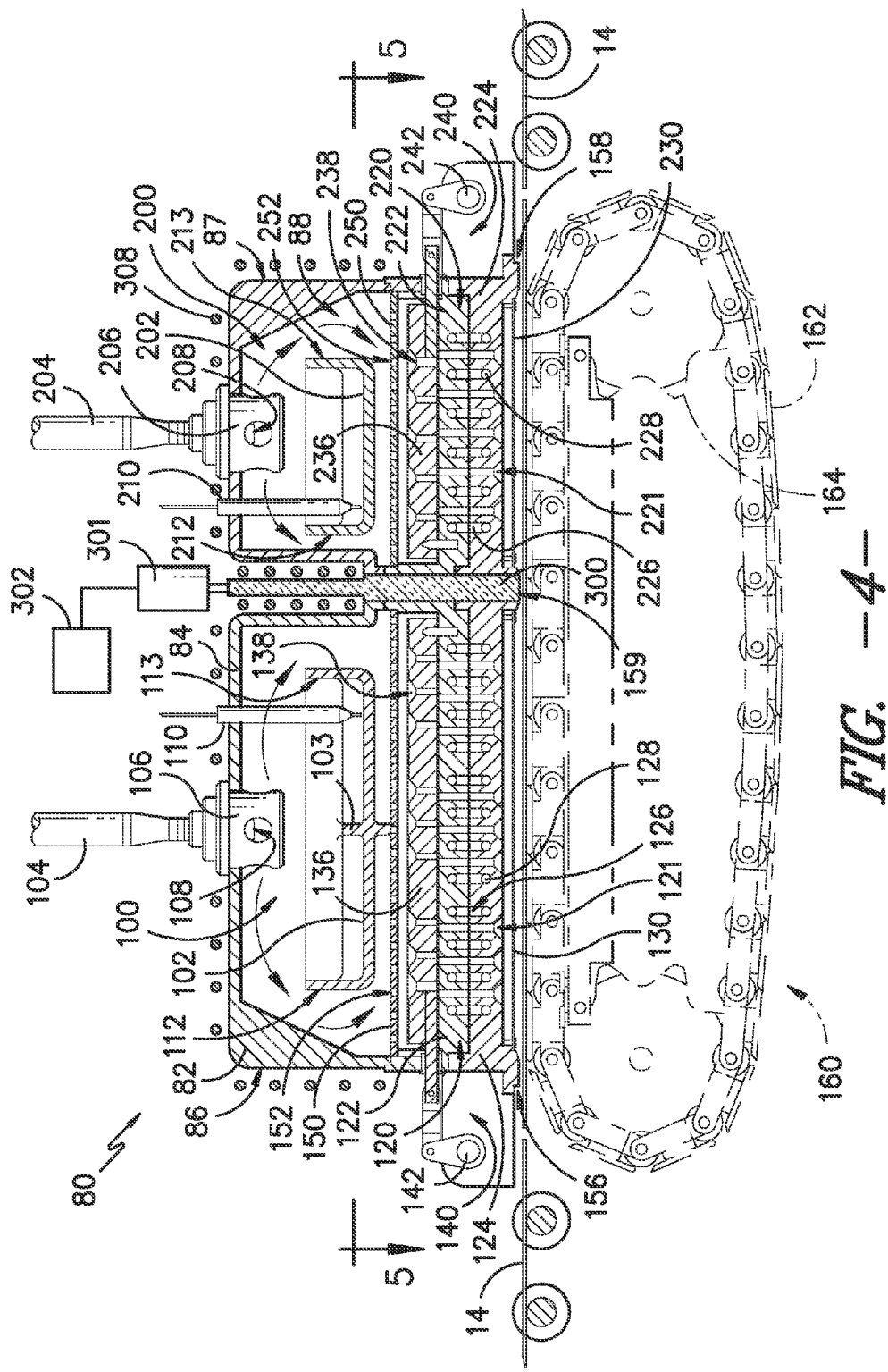
FIG. 4 is a cross-sectional view of the embodiment of FIG. 2 in cooperation with a substrate conveyor; and, FIG. 5 is a top view of the receptacle component within the embodiment of FIG. 2.

Referring to the first sublimation compartment 100, receptacle 102 is configured for receipt of a source material (not shown). As mentioned, the source material may be supplied by a first feed device 24 via a feed tube 104 (FIG. 4). The first feed tube 104 is connected to a first distributor 106 disposed in a first opening in a top wall 84 of the deposition head 82. The first distributor 106 includes a plurality of discharge ports 108 that are configured to evenly distribute the granular source material into the first receptacle 102. The first receptacle 102 has an open top and may include any configuration of internal rib elements 103 or other structural elements. In the illustrated embodiment, a first thermocouple 110 is operationally disposed through the top wall 84 of the deposition head 82 to monitor temperature within the first sublimation compartment 100 adjacent to or in the first receptacle 102. Additionally, thermocouples 110 can be included within the first sublimation compartment 100, if desired, to monitor the temperature in various areas.

The deposition head 82 also includes oppositely positioned lateral end walls 86, 87 and oppositely positioned longitudinal side walls 88, 89 (FIG. 5). A vertically positioned and adjustable internal divider 300 is positioned between the first sublimation compartment 100 and the second sublimation compartment 200. Due to their separate internal walls 90a, 90b, the source material in the first sublimation compartment 100 and in the second sublimation compartment 200 are isolated from each other while in the deposition head 82.

Referring to FIG. 5 in particular, the receptacle 102 within the first sublimation compartment 100 has a shape and configuration such that the transversely extending end walls 112, 113 of the receptacle 102 are spaced from the lateral end wall 86 and the internal lateral wall 90a, 90b, respectively. The side walls 114, 115 are lie adjacent to and in close proximity to the longitudinal side walls 88, 89, respectively, of the first sublimation compartment 100 so that very little clearance exists between the respective walls, as depicted in FIG. 5.

With this configuration, sublimated source material will flow out of the open top of the receptacle 102 and downwardly over the end walls 112, 113 as leading and trailing curtains of vapor (shown as flow lines with arrows depicting an exemplary direction of flow), as depicted by the flow lines in FIGS. 2, 3, and 5. Very little of the sublimated source material will thus be able to flow over the side walls 114, 115 of the receptacle 102.

A first heated distribution manifold 120 is disposed below the first receptacle 102. This distribution manifold 120 may take on various configurations within the scope and spirit of the invention, and serves to indirectly heat the first receptacle 102, as well as to distribute the sublimated source material that flows from the first receptacle 102. In the illustrated embodiment, the heated distribution manifold 120 has a clam-shell configuration that includes an upper shell member 122 and a lower shell member 124. Each of the shell members 122, 124 includes recesses therein that define cavities 126 when the shell members are mated together, as depicted in FIGS. 2 and 3. Heater elements 128 are disposed within the cavities 126 and serve to heat the distribution manifold 120 to a degree sufficient for indirectly heating the source material within the first receptacle 102 to cause sublimation of the source material. The heater elements 128 may be made of a material that reacts with the source material vapor and, in this regard, the shell members 122, 124 also serve to isolate the heater elements 128 from contact with the source material vapor. The heat generated by the distribution manifold 120 is also sufficient to prevent the sublimated source material from plating out onto components of the head chamber 82. Desirably, the coolest component in the head chamber 82 is the upper surface of the substrates 14 conveyed through the apparatus 80 so as to ensure that the sublimated source material plates onto the substrate 14, and not onto components of the deposition head 82.

Still referring to FIGS. 2 and 3, the first heated distribution manifold 120 includes a plurality of passages 121 defined therethrough. These passages 121 have a shape and configuration so as to help uniformly distribute the sublimated source material from the first sublimation compartment 100 towards the underlying substrates 14 (FIG. 4).

Similar to the discussion above, with respect to the first sublimation compartment 100, the second sublimation compartment 200 includes a second receptacle 202 configured for receipt of a second source material (not shown). As mentioned, the second source material may be supplied by a second feed device 25 via a second feed tube 204 (FIG. 4). The second feed tube 204 is connected to a second distributor 206 disposed in a second opening in a top wall 84 of the deposition head 82. The second distributor 206 includes a plurality of discharge ports 208 that are configured to evenly distribute the source material into the second receptacle 202. The second receptacle 102 has an open top and may include any configuration of internal rib elements (not shown) or other structural elements. In the illustrated embodiment, a second thermocouple 210 is operationally disposed through the top wall 84 of the deposition head 82 to monitor temperature within the second sublimation compartment 200 adjacent to or in the second receptacle 202. Additionally thermocouples 210 can be included within the second sublimation compartment 200, if desired, to monitor the temperature in various areas.

The second receptacle 202 within the second sublimation compartment 200 has a shape and configuration such that the transversely extending end walls 212, 213 of the receptacle 202 are spaced from the internal lateral wall 90b and the lateral end wall 87, respectively. The side walls 214, 215 are lie adjacent to and in close proximity to the longitudinal side walls 88, 89, respectively, of the second sublimation compartment 200 so that very little clearance exists between the respective walls, as depicted in FIG. 5. With this configuration, sublimated source material will flow out of the open top of the second receptacle 202 and downwardly over the end walls 212, 213 as leading and trailing curtains of vapor (shown as flow lines with arrows depicting an exemplary direction of flow), as depicted by the flow lines in FIGS. 2, 3, and 5. Very little of the sublimated source material will flow over the side walls 214, 215 of the receptacle 202.

A second heated distribution manifold 220 is disposed below the second receptacle 202. Similarly to the first distribution manifold 120, this second distribution manifold 220 may take on various configurations within the scope and spirit of the invention, and serves to indirectly heat the second receptacle 202, as well as to distribute the sublimated source material that flows from the second receptacle 202. In the illustrated embodiment, the heated distribution manifold 220 has a clam-shell configuration that includes an upper shell member 222 and a lower shell member 224. Each of the shell members 222, 224 includes recesses therein that define cavities 226 when the shell members are mated together as depicted in FIGS. 2 and 3. Heater elements 228 are disposed within the cavities 226 and serve to heat the distribution manifold 220 to a degree sufficient for indirectly heating the source material within the second receptacle 202 to cause sublimation of the source material. The heater elements 228 may be made of a material that reacts with the source material vapor and, in this regard, the shell members 222, 224 also serve to isolate the heater elements 228 from contact with the source material vapor. The heat generated by the distribution manifold 220 is also sufficient to prevent the sublimated source material from plating out onto components of the head chamber 82. Still referring to FIGS. 2 and 3, the second heated distribution manifold 220 includes a plurality of passages 221 defined therethrough. These passages have a shape and configuration so as to uniformly distribute the sublimated source material from the second sublimation compartment 200 towards the underlying substrates 14 (FIG. 4).

Since the first heated distribution manifold 120 can be separate from the second heated distribution manifold 220, as shown in the embodiment of FIGS. 2-4, the internal temperatures of the first sublimation compartment 100 and the second sublimation compartment 200 (e.g., the first receptacle 102 and the second receptacle 202) can be independently controlled.

Alternative to or additional to the heated distribution manifolds 120, 220, a first plurality of first heaters 306 are positioned around the exterior of the first sublimation compartment 100 and a second plurality of second heaters 308 are positioned around the exterior of the second sublimation compartment 200 to provide additional heat, respectively, to the first sublimation compartment 100 and the second sublimation compartment 200.

Separate heating controllers can be configured to independently adjust the temperatures within the first sublimation compartment 100 and the second sublimation compartment 200. That is, the first heated distribution manifold 120 and the first heaters 306 can be independently controlled from the second heated distribution manifold 220 and the second heaters 308 so as to independently adjust the temperatures within the first sublimation compartment 100 and the second sublimation compartment 200.

This independent temperature control allows for material to be sublimated within the first sublimation compartment 100 and the second sublimation compartment 200 that has a different sublimation temperature and/or optimum sublimation conditions. Thus, two different materials can be deposited onto the substrates 14 as each passes through the vapor deposition chamber 19. However, since the two deposition heads 100, 200 are close in proximity, heat transfer therebetween may occur. To that end, the internal divider 300 can be formed from an insulating material to minimize and inhibit thermal transfer between the first deposition head 100 and the second deposition head 200. For example, the internal divider 300 can be constructed from graphite, quartz, or another suitable material. The internal divider 300 may also have a coating thereon (e.g., a coating of SiC).

Although shown extending between the two deposition heads 100, 200, the internal divider 300 may extend only to a point suitable for connection to the actuator 301 (e.g., a motor, rod/handle for manual control, etc.) and control of the positioning of the internal divider 300. In such an embodiment, insulating material (not shown) may be positioned between the two deposition heads 100, 200.

In the illustrated embodiment, first and second distribution plates 130, 230 are disposed below the first and second sublimation compartments, respectively. These distribution plates 130, 230 are positioned at a defined distance above a horizontal plane of the upper surface of an underlying substrate 14, as depicted in FIG. 4. This distance may be, for example, between about 0.3 cm to about 4.0 cm. In a particular embodiment, the distance is about 1.0 cm. The conveyance rate of the substrates below the distribution plates 130, 230 may be in the range of, for example, about 10 mm/sec to about 40 mm/sec. In a particular embodiment, this rate may be, for example, about 20 mm/sec. For example, when depositing cadmium telluride using the first sublimation compartment, the thickness of the CdTe film layer that plates onto the upper surface of the substrate 14 can vary within the scope and spirit of the invention, and may be, for example, between about 1 micron to about 5 microns. In a particular embodiment, the film thickness may be about 3 microns.

The first and second distribution plates 130, 230 include a pattern of passages 132, 232, respectively, such as holes, slits, and the like, therethrough that further distribute the sublimated source material passing through the distribution manifolds 120, 220 such that the source material vapors are substantially uninterrupted. In other words, the pattern of passages 132, 232 are shaped and staggered or otherwise positioned to ensure that the sublimated source material is deposited completely over the substrate in the transverse direction so that longitudinal streaks or stripes of "un-coated" regions on the substrate are avoided. As previously mentioned, a significant portion of the sublimated source material will flow out of the receptacles 102, 202 as leading and trailing curtains of vapor in both the first and second sublimation compartments 100, 200, as depicted in FIG. 5. Although these curtains of vapor will diffuse to some extent in the longitudinal direction prior to passing through the distribution plates 130, 230, it should be appreciated that it is unlikely that a uniform distribution of the sublimated source material will be achieved. In other words, more of the sublimated source material will be distributed through the longitudinal end sections of the distribution plates 130, 230 as compared to the middle portion of the distribution plates 130, 230. However, as discussed above, because the system 10 conveys the substrates 14 through the vapor deposition apparatus 80 at a constant (non-stop) linear speed, the upper surfaces of the substrates 14 will be exposed to the same deposition environment regardless of any non-uniformity of the vapor distribution along the longitudinal aspect of the apparatus 80. The passages 121, 221 in the distribution manifolds 120, 220 and the holes 132, 232 in the distribution plate 130, 230 ensure a relatively uniform distribution of the sublimated source material in the transverse aspect of the vapor deposition apparatus 80. So long as the uniform transverse aspect of the vapor is maintained, a relatively uniform thin film layer is deposited onto the upper surface of the substrates 14 regardless of any non-uniformity in the vapor deposition along the longitudinal aspect of the apparatus 80, due to the substantially constant rate at which the substrates 14 are moved in the longitudinal direction of the apparatus 80.

As illustrated in the figures, it may be desired to include debris shields 150, 250 between the receptacles 102, 202 and the distribution manifolds 120, 220, respectively. These debris shields 150, 250 includes holes 152, 252 defined therethrough (which may be larger or smaller than the size of the holes 132, 232 of the distribution plates 130, 230) and primarily serves to retain any granular or particulate source material from passing through and potentially interfering with operation of the movable components of the distribution manifolds 120, 220, as discussed in greater detail below. In other words, the debris shields 150, 250 can be configured to act as a breathable screen that inhibits the passage of particles without substantially interfering with vapors flowing therethrough.

Referring to FIGS. 2 through 4 in particular, apparatus 80 desirably includes transversely extending seals 154 at each longitudinal end of the head chamber 82. In the illustrated embodiment, the seals define an entry slot 156 and an exit slot 158 at the longitudinal ends of the head chamber 82. These seals 154 are disposed at a distance above the upper surface of the substrates 14 that is less than the distance between the surface of the substrates 14 and the distribution plate 130, 230, as is depicted in FIG. 4. The seals 154 help to maintain the sublimated source material in the deposition area above the substrates. In other words, the seals 154 prevent the sublimated source material from "leaking out" through the longitudinal ends of the apparatus 80. It should be appreciated that the seals 154 may be defined by any suitable structure. In the illustrated embodiment, the seals 154 are actually defined by components of the lower shell members 124, 224 of the heated distribution manifold 120, 220. It should also be appreciated that the seals 154 may cooperate with other structure of the vapor deposition apparatus 80 to provide the sealing function. For example, the seals may engage against structure of the underlying conveyor assembly in the deposition area.

As stated above, a middle seal member 159 is defined by the internal divider 300 and is positioned between the first distribution plate 130 and the second distribution plate 230. Due to its attachment to the internal divider 300, the middle seal member 159 is adjustable to be disposed at a distance above the horizontal conveyance plane defined by the upper surface of the substrates 14 that is less than the distance between the horizontal conveyance plane defined by the substrates 14 and the distribution plate 130, 230, as is depicted in FIG. 4. That is, the middle seal member 159 can, in one embodiment, be positioned such that the first sublimated source material from the first deposition area defined under the first distribution plate 130 is prevented from substantially mixing with second sublimated source material from the second deposition area defined under the second distribution plate 230. Alternatively, the middle seal member 159 can, in one embodiment, be positioned such that the first sublimated source material from the first deposition area defined under the first distribution plate 130 and the second sublimated source material from the second deposition area defined under the second distribution plate 230 are substantially intermixed.

Thus, the intermixing of source vapors from the first deposition area 100 and the second deposition area 200 can be controlled by adjusting two variables: the vertical positioning of middle seal member 159 via control of the internal divider 300 and the width of the seal member 159 in the machine direction (i.e., the direction of the substrate conveyance).

Additionally, such intermixing may be somewhat controlled by varying the distance between the distribution plates 130, 230 and the horizontal conveyance plane defined by the upper surface of the substrates 14. For instance, if the distance between the distribution plates 130, 230 and the horizontal conveyance plane defined by the upper surface of the substrates 14 is relatively small, then little intermixing will be realized in practice due to the tendency of the sublimated source vapors to deposit on the substrates 14 relatively quickly. As such, increasing the distance between the distribution plates 130, 230 and the horizontal conveyance plane defined by the upper surface of the substrates 14 can result in more intermixing.

Any manner of longitudinally extending seal structures 155 may also be configured with the apparatus 80 to provide a seal along the longitudinal sides thereof. Referring to FIGS. 2 and 3, this seal structure 155 may include a longitudinally extending side member that is disposed generally as close as reasonably possible to the upper surface of the underlying convey surface so as to inhibit outward flow of the sublimated source material without frictionally engaging against the conveyor.

Referring to FIGS. 2 and 3, the illustrated embodiment includes movable first and second shutter plates 136, 236 disposed respectively above the distribution manifolds 120, 220. These shutter plates 136, 236 includes a plurality of passages 138, 238 defined therethrough that align with the passages 121 in the distribution manifold 120 in an open operational position of the shutter plates 136, 236 as depicted in FIG. 3. As can be readily appreciated from FIG. 3, in this operational position of the shutter plates 136, 236, the sublimated source material is free to flow through the passages 138, 238 defined in the shutter plates 136, 236, respectively, and through the passages 121, 221 in the distribution manifolds 120, 220 for subsequent distribution through the plates 130, 230. Referring to FIG. 2, the shutter plates 136, 236 are movable to a closed position relative to the upper surfaces of the distribution manifolds 120, 220 wherein the passages 138, 238 in the shutter plates 136, 236 are misaligned with the passages 121, 221 in the distribution manifolds 120, 220, respectively. In this configuration, the sublimated source material is blocked from passing through the distribution manifolds 120, 220, and is essentially contained within the first and second sublimation compartments, respectively, of the head chamber 82.

Any suitable actuation mechanism, generally 142 and 242 may be configured for moving the shutter plates 136, 236 between the first and second operational positions. In the illustrated embodiment, the actuation mechanisms 142, 242 are attached to the respective shutter plates 136, 236 via any suitable linkage 140, 240 to control the positioning thereof.

In the embodiment shown, the shutter plates 136, 236 can be independently moved between the first and second operational positions. That is, the flow of sublimation material from either of the first sublimation compartment 100 and the second sublimation compartment 200 can be controlled, regardless of the operational position of the other compartment. The shutter plate 136, 236 configuration illustrated in FIGS. 2 and 3 is particularly beneficial in that the flow rate of the sublimated source material can be quickly and easily regulated within the respective sublimation compartment 100, 200 during a large scale manufacturing process without interruption.

Referring to FIG. 4, the vapor deposition apparatus 80 may further comprise a conveyor 160 disposed below the head chamber 82. This conveyor 160 may be uniquely configured for the deposition process as compared to the conveyors 48 discussed above with respect to the system 10 of FIG. 1. For example, the conveyor 160 may be a self-contained conveying unit that includes a continuous loop conveyor on which the substrates 14 are supported below the distribution plates 130, 230. In the illustrated embodiment, the conveyor 160 is defined by a plurality of slats 162 that provide a flat, unbroken (i.e., no gaps between the slats) support surface for the substrates 14. The slat conveyor is driven in an endless loop around sprockets 164. It should be appreciated, however, that the invention is not limited to any particular type of conveyor 160 for moving the substrates 14 through the vapor deposition apparatus 80.

The present invention also encompasses various process embodiments for vapor deposition of a sublimated source material to form a thin film on a PV module substrate, and subsequent vapor treatment. The various processes may be practiced with the system embodiments described above or by any other configuration of suitable system components. It should thus be appreciated that the process embodiments according to the invention are not limited to the system configuration described herein.

For example, the method for depositing a thin film on a substrate can include heating a first source material in a first receptacle positioned within a first chamber of a deposition head to form first source vapors, and directing the first source vapors through a distribution plate. A second source material can also be heated in a second receptacle positioned within a second chamber of the deposition head to form second source vapors, which can then be directed through the distribution plate. A substrate can be transported past the distribution plate such that a first majority of the first source vapors deposit on a deposition surface of the substrate prior to a second majority of the second source vapors.

In one particular embodiment of the method, the first source material can include an n-type semiconductor (e.g., cadmium sulfide), and the second source material can include a cadmium telluride. In such an embodiment, the control of intermixing of the first sublimated source material and the second sublimated source material allows for more precise control of the stoichiometry of a heterojunction region positioned between the n-type semiconductor thin film layer (e.g., cadmium sulfide) and the cadmium telluride thin film layer.

Desirably, the process embodiments include continuously conveying the substrates at a constant linear speed during the vapor deposition process.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A vapor deposition apparatus to form stacked thin films on discrete photovoltaic module substrates conveyed in a continuous non-stop manner through said apparatus, the apparatus comprising:
   a first sublimation compartment positioned over a first deposition area of said apparatus, wherein said first sublimation compartment is configured to heat a first source material therein to sublimate the first source material into first source material vapors;
   a second sublimation compartment positioned over a second deposition area of said apparatus, wherein said second sublimation compartment is configured to heat a second source material therein to sublimate the second source material into second source material vapors;
   an internal divider positioned between the first sublimation compartment and the second sublimation compartment, the internal divider defining a middle seal member; and,
   an actuator attached to the internal divider and configured to move the internal divider to control intermixing of the first source material vapors and the second source material vapors within the first deposition area and the second deposition area.

2. The apparatus as in claim 1, further comprising:
   a computing device in communication with the actuator and configured to control the positioning of the internal divider relative to the first deposition area and the second deposition area.

3. The apparatus as in claim 1, further comprising:
   a first distribution plate at a defined distance above a horizontal conveyance plane of an upper surface of substrates conveyed through the first deposition area of said apparatus, wherein said first distribution plate is positioned between the first sublimation compartment and the horizontal conveyance plane; and
   a second distribution plate at a defined distance above the horizontal conveyance plane of the upper surface of substrates conveyed through the second deposition area of said apparatus, wherein said second distribution plate is positioned between the second sublimation compartment and the horizontal conveyance plane.

4. The apparatus as in claim 3, wherein the middle seal member is adjustable between the horizontal conveyance plane of the upper surface of substrates and a distribution plane defined by the first distribution plate.

5. The apparatus as in claim 3, wherein the first sublimation compartment and the second sublimation compartment are isolated from each other above the first distribution plate and the second distribution plate such that the sublimated first source material is substantially prevented from mixing with the sublimated second source material prior to passing through the first distribution plate and the second distribution plate, respectively.

6. The apparatus as in claim 3, wherein the middle seal member is adjustable between the horizontal conveyance plane of the upper surface of substrates and a distribution plane defined by the second distribution plate.

7. The apparatus as in claim 6, wherein the seal member has a ratio of longitudinal length to gap distance of from about 10:1 to about 100:1.

8. The apparatus as in claim 6, wherein the first deposition area and the second deposition area define a single continuous deposition area.

9. The apparatus of claim 1, wherein the first sublimation compartment comprises:
   a first receptacle configured for receipt of the first source material;
   a first heated distribution manifold disposed below said first receptacle, said first heated distribution manifold configured to heat said first receptacle to a degree sufficient to sublimate the first source material within said first receptacle to form the first source material vapors, and wherein a first shutter plate is disposed above said first distribution manifold, said first shutter plate comprising a plurality of first passages therethrough that align with said first passages in said first distribution manifold in an open-position of said first shutter plate to allow passage of the first source material vapors through said first heated distribution manifold.

10. The apparatus of claim 9, wherein said first heated distribution manifold defines a plurality of first passages to allow passage of sublimated first source material therethrough, and first internal heating elements arranged between said first passages in said first heated distribution manifold.

11. The apparatus of claim 10, wherein said first distribution manifold comprises a first upper shell member and a first lower shell member, said first upper and lower shell members defining internal cavities in which said first heating elements are disposed.

12. The apparatus of claim 9, wherein the second sublimation compartment comprises:
   a second receptacle configured for receipt of the second source material;
   a second heated distribution manifold disposed below said second receptacle, said second heated distribution manifold configured to heat said second receptacle to a degree sufficient to sublimate the second source material within said second receptacle to form the second source material vapors, and wherein a second shutter plate is disposed above said second distribution manifold, said second shutter plate comprising a plurality of second passages therethrough that align with said second passages in said second distribution manifold in an open-position of said second shutter plate to allow passage of the second source material vapors through said second heated distribution manifold.

13. The apparatus of claim 12, wherein the second heated distribution manifold defines a plurality of second passages to allow passage of sublimated second source material therethrough, and second internal heating elements arranged between said second passages in said second heated distribution manifold.

14. The apparatus of claim 12, further comprising:
   a first controller configured to control the temperature of the first heated distribution manifold; and
   a second controller configured to control the temperature of the second heated distribution manifold,
   wherein the first controller and the second controller are independent from one another.

15. A vapor deposition apparatus to form stacked thin films on discrete photovoltaic module substrates conveyed in a continuous non-stop manner through said apparatus, the apparatus comprising:
   a first sublimation compartment positioned over a first deposition area of said apparatus, wherein the first sublimation compartment comprises:
      a first receptacle configured for receipt of a first source material;
      a first heated distribution manifold disposed below said first receptacle, said first heated distribution manifold configured to heat said first receptacle to a degree sufficient to sublimate the first source material within said first receptacle; and, a first shutter plate disposed above said first distribution manifold, said first shutter plate comprising a plurality of first passages therethrough that align with said first passages in said first distribution manifold in an open-position of said first shutter plate to allow passage of sublimated first source material through said first heated distribution manifold;

a second sublimation compartment positioned over a second deposition area of said apparatus, wherein the second sublimation compartment comprises:

a second receptacle configured for receipt of a second source material;

a second heated distribution manifold disposed below said second receptacle, said second heated distribution manifold configured to heat said first receptacle to a degree sufficient to sublimate the second source material within said second receptacle; and, a second shutter plate disposed above said second distribution manifold, said second shutter plate comprising a plurality of second passages therethrough that align with said second passages in said second distribution manifold in an open-position of said second shutter plate to allow passage of sublimated second source material through said second heated distribution manifold;

an internal divider positioned between the first sublimation compartment and the second sublimation compartment, the internal divider defining a middle seal member; and, an actuator attached to the internal divider and configured to move the internal divider to control intermixing of the sublimated first source material and the sublimated second source material within the first deposition area and the second deposition area.

16. The apparatus of claim 15, further comprising:
a computing device in communication with the actuator, wherein the computing device is configured to control the movement of the internal divider via the actuator.

17. The apparatus of claim 16, further comprising:
a first controller configured to control the temperature of the first heated distribution manifold; and
a second controller configured to control the temperature of the second heated distribution manifold,
wherein the first controller and the second controller are independent from one another, and wherein the first controller and the second controller are in communication with the computing device, and further wherein the computing device is configured to control the temperature of the first heated distribution manifold and second heated distribution manifold.

18. The apparatus as in claim 15, further comprising:
a first distribution plate at a defined distance above a horizontal conveyance plane of an upper surface of substrates conveyed through the first deposition area of said apparatus, wherein said first distribution plate is positioned between the first sublimation compartment and the horizontal conveyance plane; and
a second distribution plate at a defined distance above the horizontal conveyance plane of the upper surface of substrates conveyed through the second deposition area of said apparatus, wherein said second distribution plate is positioned between the second sublimation compartment and the horizontal conveyance plane;
wherein the middle seal member is positioned between the first distribution plate and the second distribution plate.

19. A method for depositing stacked thin films on a substrate, the method comprising:
heating a first source material in a first receptacle positioned within a first chamber of a deposition head to form first source vapors;
directing the first source vapors through a first distribution plate;
heating a second source material in a second receptacle positioned within a second chamber of the deposition head to form second source vapors, wherein the first chamber is positioned adjacent to the second chamber;
directing the second source vapors through a second distribution plate;
controlling intermixing between the first source vapors and the second source vapors by controlling the positioning of an internal divider; and,
transporting a substrate past the first chamber and past the second distribution plate.

20. The method of claim 19,
the internal divider defining a seal member, wherein the internal divider is positioned between the first distribution plate and the second distribution plate so as to control intermixing between the first source vapors and the second source vapors.

21. The method of claim 20, wherein the positioning of the internal divider is controlled via an actuator.

* * * * *